(12) United States Patent
Sanada

(10) Patent No.: US 12,376,261 B2
(45) Date of Patent: Jul. 29, 2025

(54) COOLING DEVICE FOR ELECTRONIC APPARATUS

(71) Applicant: TOSHIBA TEC KABUSHIKI KAISHA, Tokyo (JP)

(72) Inventor: Tsuyoshi Sanada, Susono Shizuoka (JP)

(73) Assignee: TOSHIBA TEC KABUSHIKI KAISHA, Tokyo (JP)

( * ) Notice: Subject to any disclaimer, the term of this patent is extended or adjusted under 35 U.S.C. 154(b) by 238 days.

(21) Appl. No.: 18/337,066

(22) Filed: Jun. 19, 2023

(65) Prior Publication Data

US 2024/0206111 A1 Jun. 20, 2024

(30) Foreign Application Priority Data

Dec. 20, 2022 (JP) ................................ 2022-202903

(51) Int. Cl.
*H05K 7/20* (2006.01)
*G06F 1/20* (2006.01)

(52) U.S. Cl.
CPC ......... *H05K 7/20154* (2013.01); *G06F 1/206* (2013.01); *H05K 7/20145* (2013.01); *H05K 7/2039* (2013.01)

(58) Field of Classification Search
CPC ... H01L 23/3672; H01L 23/4093; G06F 1/20; G06F 1/206; G06F 2200/201; G06F 1/203; H05K 7/20154; H05K 7/20145; H05K 7/2039; H05K 7/20172; H05K 7/20409; H05K 7/20727; H05K 7/20745; F24F 1/0029; F24F 1/0059; F24F 13/082; F24F 13/20; F24F 2013/0616; B60H 1/00042;
(Continued)

(56) References Cited

U.S. PATENT DOCUMENTS 7,515,414 B2 * 4/2009 Horng .................. H01L 23/467
361/695
2005/0041392 A1 * 2/2005 Chen .................. H05K 7/20727
361/695
(Continued)

FOREIGN PATENT DOCUMENTS

JP 2003-282171 10/2003

*Primary Examiner* — Michael A Matey
(74) *Attorney, Agent, or Firm* — Amin, Turocy & Watson, LLP

(57) ABSTRACT

A first air blower is rotated to blow air so as to create a flow of air between fins of a heat sink, and has a first discharge surface for discharging air toward the heat sink. A second air blower is rotated to blow air so as to create a flow of air between the fins, has a second discharge surface for discharging air toward the heat sink, and is provided adjacent to the first air blower. A duct covers the heat sink, the first air blower, and the second air blower, and has intake ports upstream and an exhaust port downstream in an air blowing direction of the first air blower and the second air blower. A partition member is provided between the heat sink and the first air blower and the second air blower, and has a bottom plate and a partition wall. The bottom plate is in contact with a base portion and configured to conduct heat of the base portion. The partition wall stands on the bottom plate and divides a space above the bottom plate from a position between the first discharge surface and the second discharge surface to one of the fins.

20 Claims, 10 Drawing Sheets

(58) Field of Classification Search
CPC .. B60H 1/00; B01D 2267/70; B01D 2273/14; B01D 2279/50; B01D 46/0006; B01D 46/12; B01D 46/18; F28D 2021/0029; F28D 5/00

See application file for complete search history.

(56) References Cited

U.S. PATENT DOCUMENTS

| | | | | |
|---|---|---|---|---|
| 2007/0256433 | A1* | 11/2007 | Bhatti | F24F 1/035 62/304 |
| 2008/0062641 | A1* | 3/2008 | Lai | H01L 23/467 257/E23.099 |
| 2009/0129018 | A1* | 5/2009 | Zhou | H01L 23/467 361/697 |
| 2015/0219348 | A1* | 8/2015 | Ikeda | F24F 1/0018 415/206 |
| 2016/0187041 | A1* | 6/2016 | Yoshikawa | F25D 21/14 62/81 |
| 2018/0008926 | A1* | 1/2018 | Oishi | F24F 13/20 |

* cited by examiner

COOLING DEVICE FOR ELECTRONIC APPARATUS

CROSS-REFERENCE TO RELATED APPLICATION

This application is based upon and claims the benefit of priority from Japanese Patent Application No. 2022-202903, filed on Dec. 20, 2022, the entire contents of which are incorporated herein by reference.

FIELD

Embodiments described herein relate generally to a cooling device for an electronic apparatus.

BACKGROUND

In the related art, an electronic apparatus such as a personal computer (PC) includes a high-temperature component such as a central processing unit (CPU). A heat sink is generally attached to such a component for heat dissipation. Air suctioned by a fan installed upstream flows to the heat sink and is exhausted downstream of the heat sink, so that heat is dissipated.

Recently, there is a strong demand for miniaturization of an electronic apparatus, and there is a demand for miniaturization of a cooling fan that blows air to a heat sink. However, when a cooling fan is miniaturized, a discharge amount of cooling air is reduced, and thus cooling performance of a heat sink is low, which is not preferable.

DETAILED DESCRIPTION

In general, according to one embodiment, there is provided a cooling device for an electronic apparatus in which miniaturization of a cooling fan can be implemented without reducing a discharge amount of cooling air.

According to an embodiment, a cooling device for an electronic apparatus includes a heat sink in which a plurality of fins stand up side by side in a thickness direction on a base portion that conducts heat of an electronic component, a first air blower, a second air blower, a duct, and a partition member. The first air blower is rotated to blow air so as to create a flow of air between the fins, and has a first discharge surface for discharging the air toward the heat sink. The second air blower is rotated to blow air so as to create a flow of air between the fins, has a second discharge surface for discharging the air toward the heat sink, and is provided adjacent to the first air blower. The duct covers the heat sink, the first air blower, and the second air blower, and has intake ports upstream and an exhaust port downstream in an air blowing direction of the first air blower and the second air blower. The partition member is provided between the heat sink and the first air blower and the second air blower, and has a bottom plate and a partition wall. The bottom plate is in contact with the base portion and configured to conduct heat of the base portion. The partition wall stands on the bottom plate and divides a space above the bottom plate from a position between the first discharge surface and the second discharge surface to one of the fins.

First Embodiment

Figure 1:
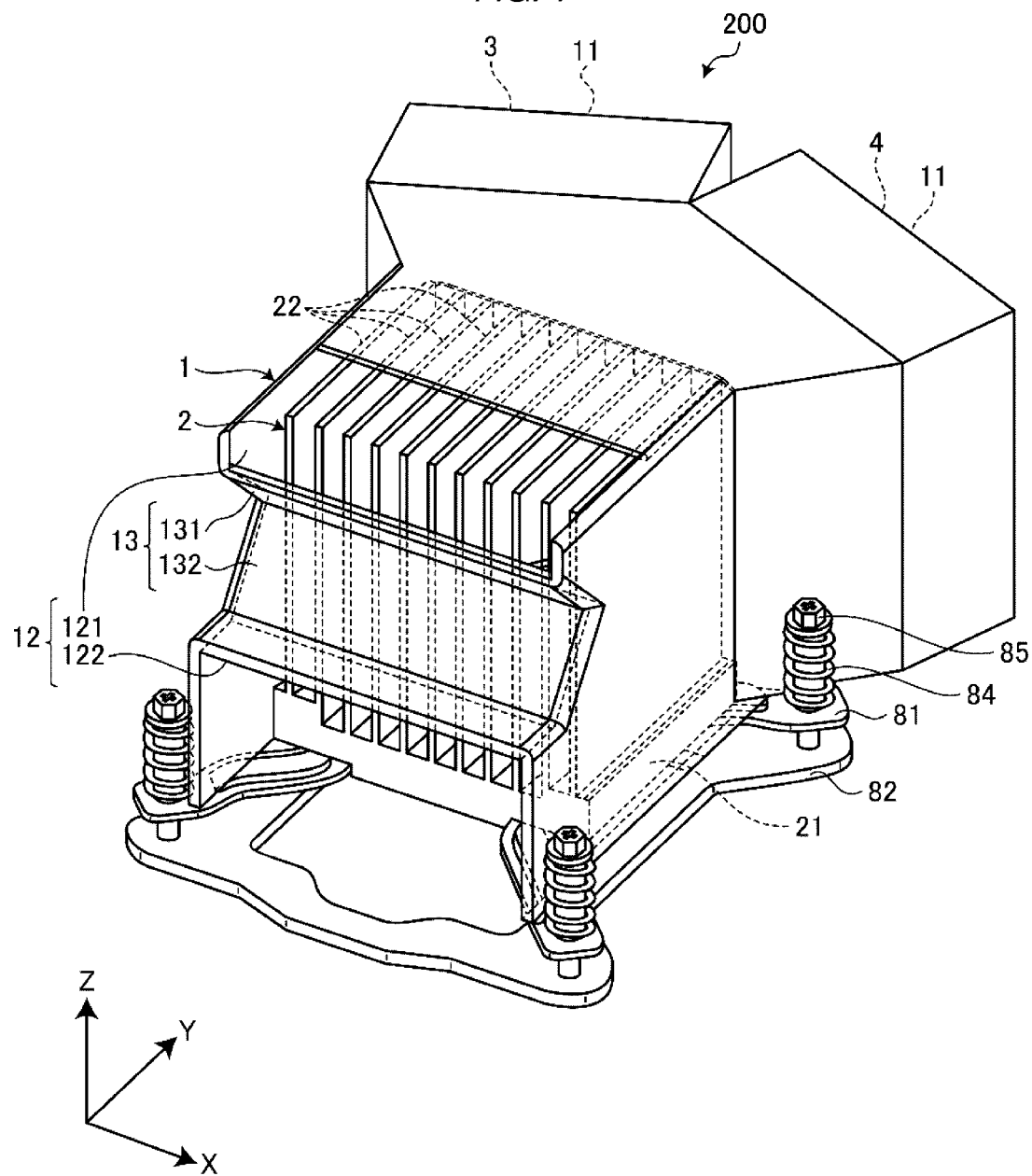
FIG. 1 is a perspective view illustrating an example of an appearance of a cooling device according to a first embodiment.
Figure 2:
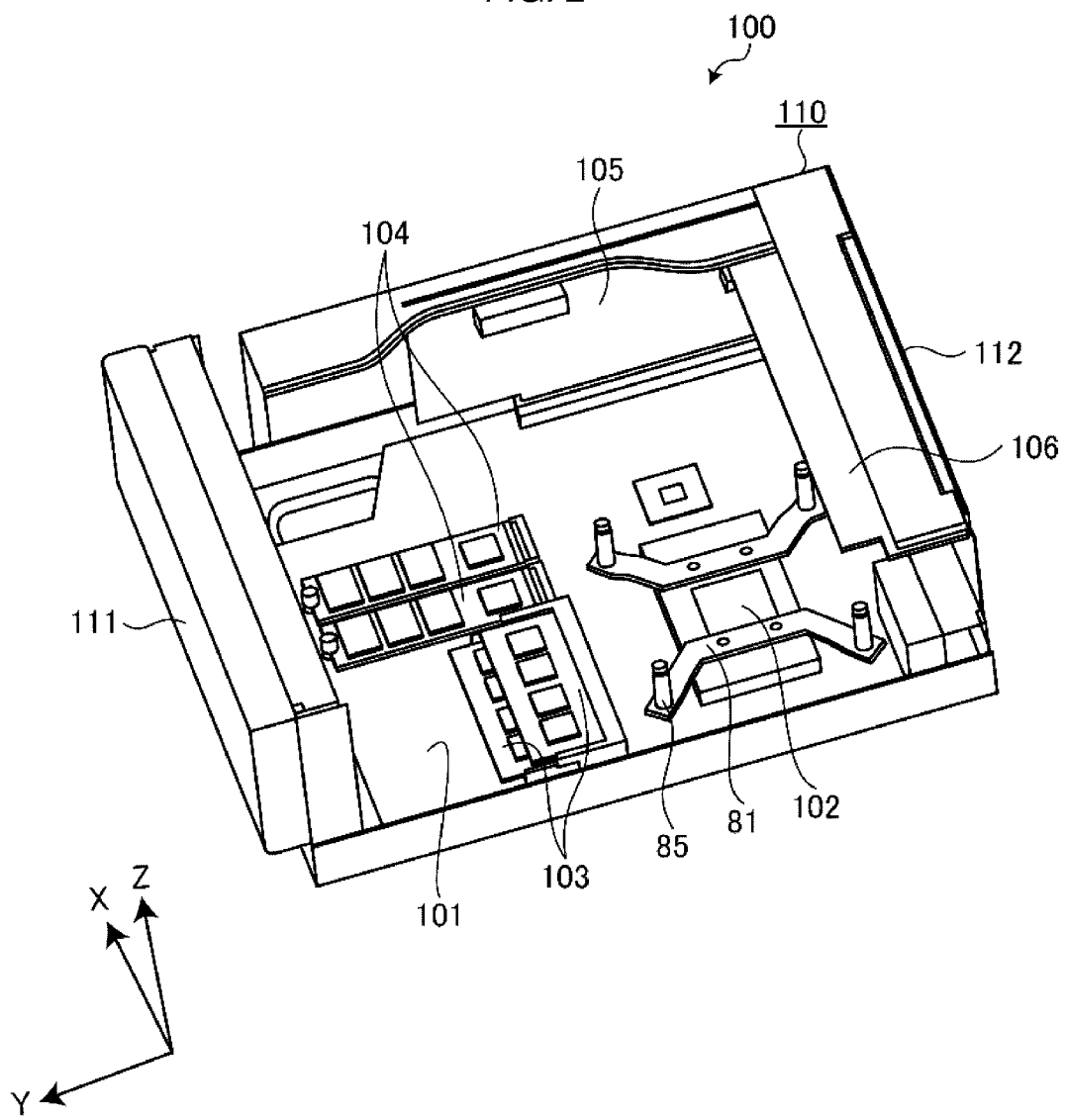
FIG. 2 is a perspective view schematically illustrating an example of a structure of an electronic apparatus.

Embodiments will be described with reference to the drawings. FIG. 1 is a perspective view illustrating an example of an appearance of a cooling device 200 according to a first embodiment. FIG. 2 is a perspective view schematically illustrating an example of a structure of an electronic apparatus 100 to which the cooling device 200 is attached. Here, for convenience of explanation, a three-dimensional coordinate system is illustrated in the drawings. In the three-dimensional coordinate system, a width direction (a left-right direction) of the cooling device 200 and the electronic apparatus 100 is defined as an X-axis direction, a depth direction (a front-rear direction) is defined as a Y-axis direction, and a height direction (an up-down direction) is defined as a Z-axis direction. A positive direction of a Y axis is a direction from a back surface side to a front surface side of the electronic apparatus 100, and the positive direction of the Y axis is referred to as "front". A positive direction of a Z axis is a direction from bottom to top.

As illustrated in FIG. 1, the cooling device 200 includes a duct 1, a heat sink 2, and fans 3 and 4. The duct 1 has a substantially box shape, and covers the heat sink 2 and the fans 3 and 4 that blow air to the heat sink 2. The duct 1 is provided with intake ports 11 upstream and an exhaust port 12 downstream in an air blowing direction of the fans 3 and 4. The duct 1 discharges, from the exhaust port 12, air that is suctioned from the intake ports 11 by the fans 3 and 4. A flow direction of air sent by the fans 3 and 4 is directed to a Y-axis negative direction (a rear side) by the duct 1.

Hereinafter, the term "upstream" refers to upstream (a windward side) based on an air flow direction (the Y axis negative direction) in the duct 1. Similarly, the term "downstream" refers to downstream (a leeward side) based on the air flow direction in the duct 1.

The heat sink 2 is generally formed of a metal material having high thermal conductivity such as aluminum or copper, and is attached to a heat generating electronic component (a heat source). The heat source is, for example, a central processing unit (CPU). Heat generated by the CPU is conducted to the heat sink 2, and heat of the heat sink 2 is dissipated to surrounding air. Accordingly, malfunction or the like due to overheating of the CPU is prevented.

The heat sink 2 includes a base portion 21 and a plurality of fins 22. The base portion 21 receives heat generated by the electronic component. The plurality of fins 22 are standing side by side on the base portion 21 in a thickness direction. The plurality of fins 22 are adjacent to one another at a predetermined interval. The base portion 21 is in contact with the CPU and receives heat conducted from the CPU. The fins 22 dissipate heat conducted from the base portion 21 that is continuous with the fins 22 into air. Air flowing in the duct 1 passes between the fins 22 of the heat sink 2 so as to promote heat dissipation.

The heat sink 2 is fixed by a helical spring 84 and a screw 85 on frames 81 and 82 that form layers at a predetermined interval. A mother board 101 (see FIG. 2) is interposed between the frame 81 and the frame 82.

The fan 3 is an example of a first air blower disclosed herein. The fan 4 is an example of a second air blower disclosed herein. The fan 3 has a first discharge surface for discharging air suctioned from the outside toward the heat sink 2. The fan 4 has a second discharge surface for discharging air suctioned from the outside toward the heat sink 2.

The fan 3 and the fan 4 according to the present embodiment have the same size, and are symmetrically arranged relative to a plane with an included angle of 90 degrees or more between the fan 3 and the fan 4. The plane passes through a central position in a width direction of the heat sink 2 along an X axis and is parallel to the fins 22 (a plane parallel to an YZ plane).

The fans 3 and 4 are axial fans, and continuously send air by rotationally driving a propeller including one or more blades around a rotation shaft by, for example, a transmission motor. The fans 3 and 4 blow air to create a flow of air between the fins 22. Air sent by the fans 3 and 4 carries heat dissipated by the fins 22 and the base portion 21 downstream, and promotes heat dissipation. In this manner, the fans 3 and 4 cool the heat sink 2.

In the present embodiment, the intake ports 11, the fan 3 or the fan 4, the heat sink 2, and the exhaust port 12 are arranged in this order upstream to downstream in an air flow direction in the duct 1. Air suctioned and sent from the intake ports 11 by the fans 3 and 4 flows mainly around the fins 22 of the heat sink 2, takes away heat of the fins 22, and is discharged from the exhaust port 12.

In the duct 1, air blown by the fan 3 efficiently acts on heat dissipated by the heat sink 2, and a heat dissipation effect is improved. Specifically, the duct 1 surrounds the heat sink 2, and a range in which air sent by the fan 3 that cools the heat sink 2 flows is divided in the duct 1. Air in the duct 1 is replaced with air that is suctioned from the intake port 11 by the rotation of the fan 3, and is pushed out from the exhaust port 12. Accordingly, air surrounding the heat sink 2 is quickly replaced.

In order to sufficiently exhibit the effect of the cooling device 200 as described above, it is desirable that no component (obstacle) that prevents air exhaustion be present on a leeward side of the exhaust port 12. However, an obstacle may be disposed downstream of the exhaust port 12 depending on a size of the electronic apparatus 100 including the cooling device 200, an arrangement of built-in components, or the like.

As illustrated in FIG. 2, the electronic apparatus 100 includes the mother board 101, a CPU 102, a memory 103, a solid state drive (SSD) 104, a riser card 105, an I/O board 106, and a casing 110. The casing 110 houses the above-described units (the mother board 101, the CPU 102, the memory 103, the SSD 104, the riser card 105, and the I/O board 106).

The mother board 101 is an example of a substrate on which an electronic component (the CPU 102 in the present embodiment) of which heat is dissipated by the heat sink 2 is mounted. Since the memory 103 and the SSD 104 generates heat in accordance with an operation, the memory 103 and the SSD 104 may be regarded as heat sources. Heat generated by the heat sources is also dissipated by an air flow in the casing 110 created by air blown by the fans 3 and 4.

The I/O board 106 is connected to the mother board 101 via an insertion port (a slot) of the riser card 105. Since the I/O board 106 is arranged parallel to the mother board 101 by being connected to the insertion port of the riser card 105, it is possible to reduce a height dimension of the casing 110.

With the arrangement described above, when the I/O board 106 is located downstream of the exhaust port 12, the I/O board 106 becomes an obstacle that prevents air exhaustion. In the present embodiment, air exhausted from the duct 1 avoids the I/O board 106.

Figure 3:
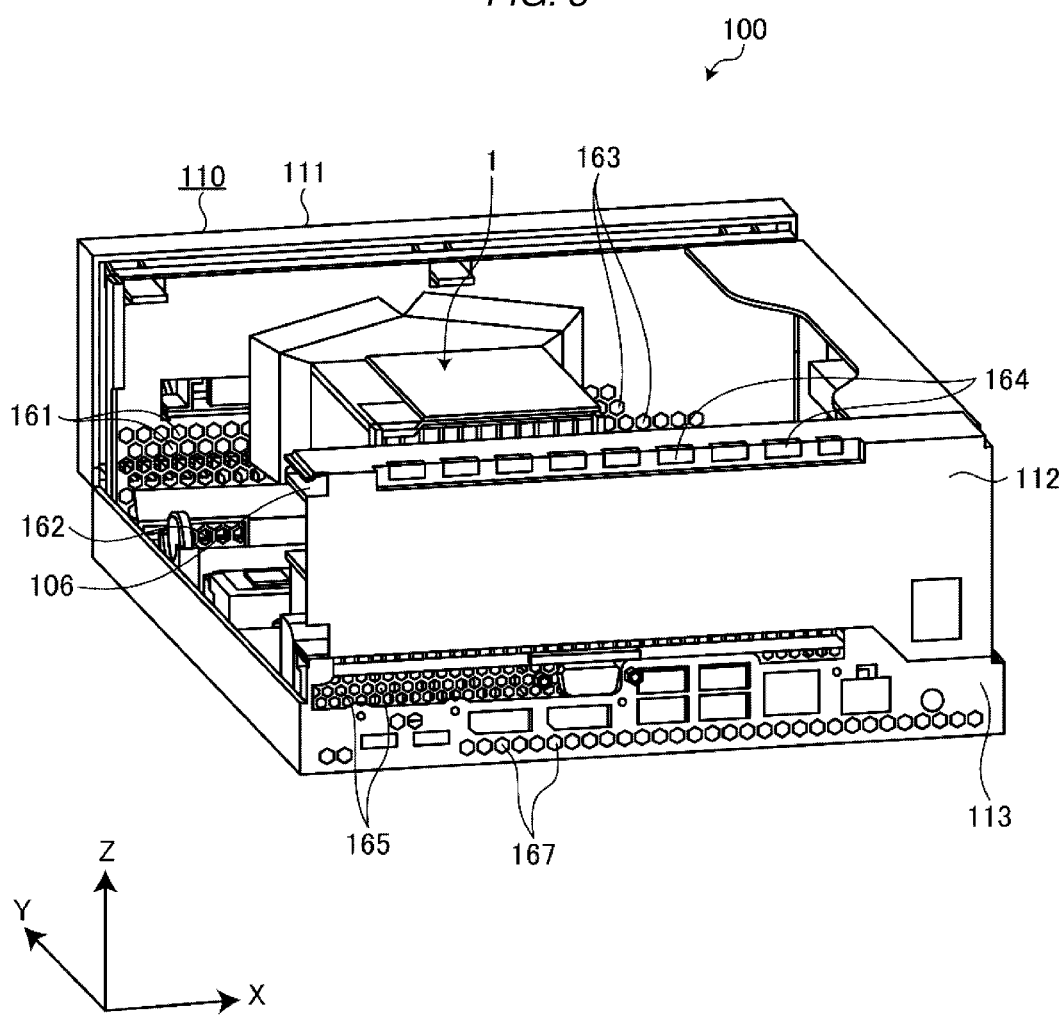
FIG. 3 is a perspective view illustrating an example of ventilation holes.

FIG. 3 is a perspective view illustrating an example of ventilation holes 161 to 167 provided in the electronic apparatus 100. This perspective view is taken as the electronic apparatus 100 is viewed from a back side.

The duct 1 is accommodated in the casing 110 of the electronic apparatus 100. The casing 110 is provided with the ventilation holes 161, 162, and 163 for taking in air to be suctioned into the duct 1, and the ventilation holes 164, 165, and 167 for exhausting air that passed through the duct 1.

The ventilation holes 161, 162, and 163 are provided in a front cover 111 that constitutes a front surface of the casing 110. The ventilation holes 164 are provided in a rear cover 112 that constitutes a back surface of the casing 110. The ventilation holes 165 and 167 are provided in an I/O panel 113 that constitutes a part of the back surface of the casing 110. The I/O panel 113 includes connection terminals for various peripheral devices to connect to the electronic apparatus 100.

The electronic apparatus 100 according to the present embodiment is provided with the I/O board 106 at rear of the CPU 102. Therefore, the exhaust port 12 of the duct 1 is divided into an upper exhaust port 121 that opens upward and a lower exhaust port 122 that opens downward, so that exhausted air avoids the I/O board 106 (see FIG. 1). Specifically, the exhaust port 12 is divided into the upper exhaust port 121 and the lower exhaust port 122 by a branch wall 13.

Figure 4:
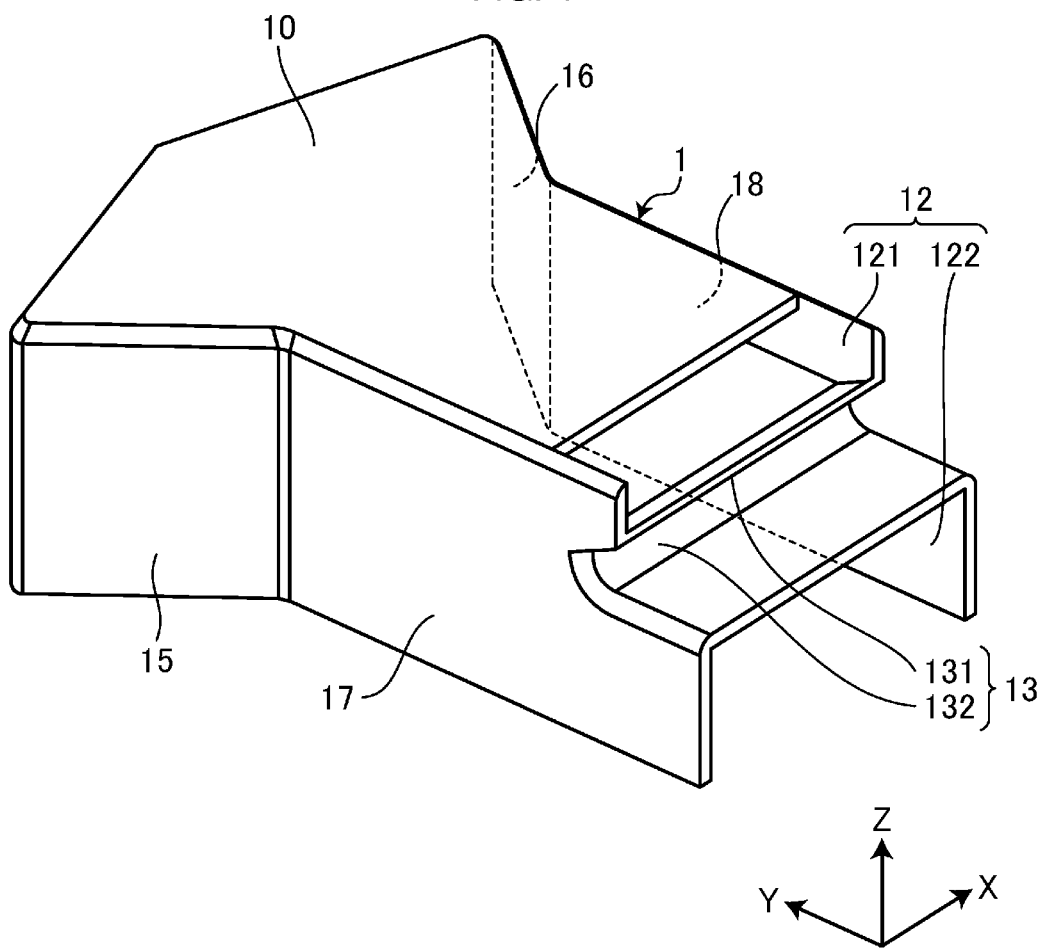
FIG. 4 is a perspective view illustrating an example of a shape of a duct.

FIG. 4 is a perspective view illustrating an example of a shape of the duct 1. The duct 1 has a shape of which a side where the fan 3 and the fan 4 are attached and a side where the exhaust port 12 is provided are opened.

The duct 1 includes a top plate 10 and side walls 15 to 18. The top plate 10 constitutes an upper portion of the duct 1 in the Z-axis direction, and faces top end portions of the fins 22. The side walls 17 and 18 face two side portions of the heat sink 2. The side walls 15 and 16 respectively connect the side walls 17 and 18 and side portions of the fans 3 and 4, and define a space between the fans 3 and 4 and the heat sink 2.

In the duct 1 as described above, air sent out by the fans 3 and 4 reaches the heat sink 2 without leaking from the duct 1. The side walls 15 and 16 are an example of first wall portions disclosed herein.

The branch wall 13 is provided downstream (a Y-axis negative side) of the duct 1. The branch wall 13 includes an upper wall portion 131 and a lower wall portion 132. A part of air that passed between the fins 22 of the heat sink 2 flows along the upper wall portion 131 and is discharged from the upper exhaust port 121. Remaining air that passed between the fins 22 of the heat sink 2 flows along the lower wall portion 132 and is discharged from the lower exhaust port 122.

Figure 5:
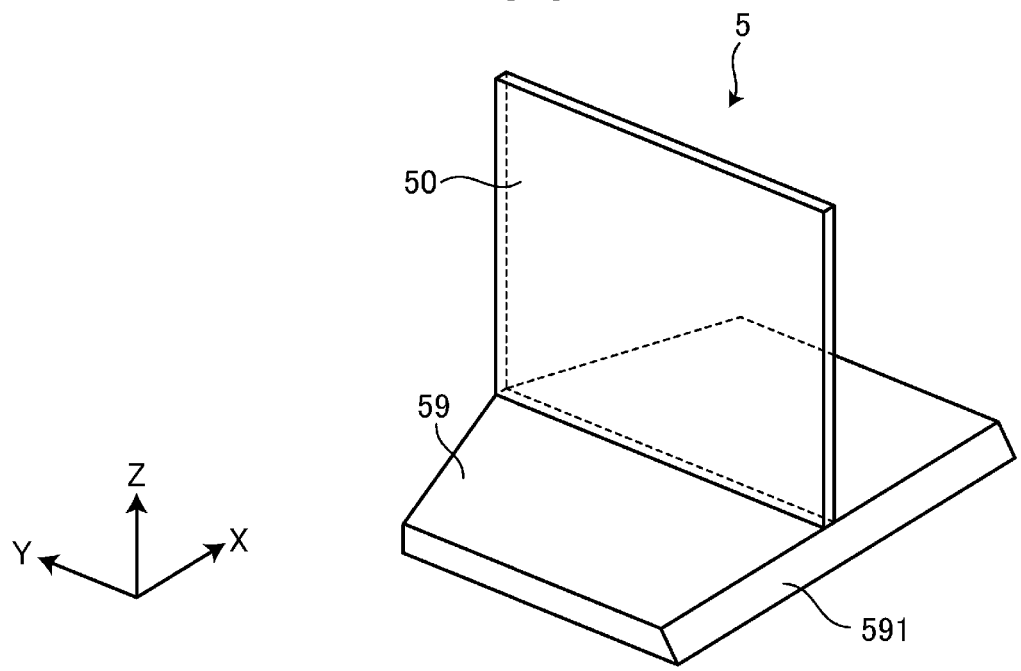
FIG. 5 is a view illustrating a shape of a partition member.
Figure 6:
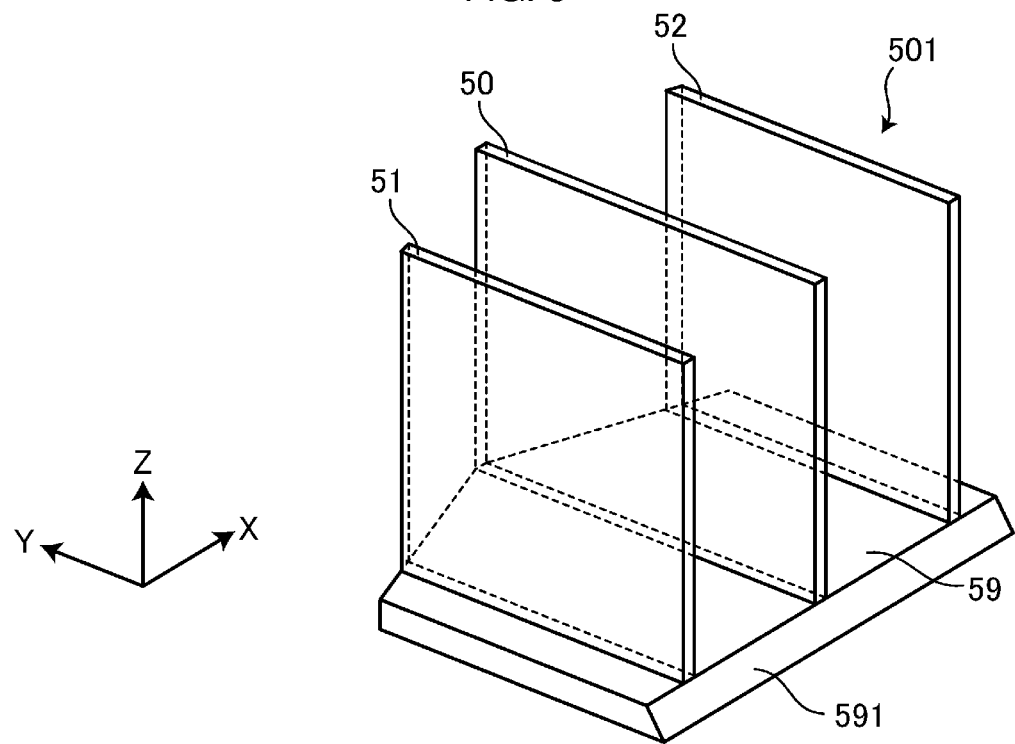
FIG. 6 is a view illustrating a shape of a partition member.
Figure 7:
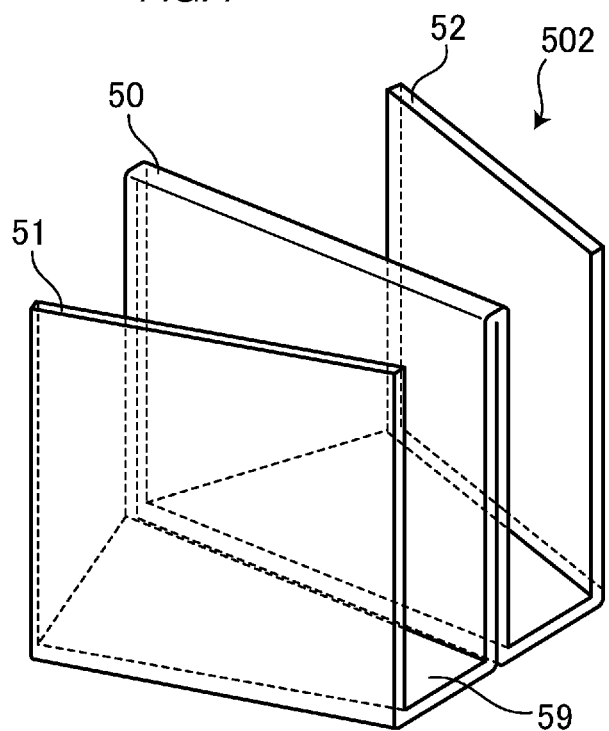
FIG. 7 is a view illustrating a shape of a partition member.

FIGS. 5, 6, and 7 are views illustrating shapes of partition members 5, 501, and 502. The cooling device 200 includes any one of the partition members 5, 501, and 502 illustrated in FIGS. 5, 6, and 7. The partition members 5, 501, and 502 are provided upstream (a Y-axis positive side) of the heat sink 2 in the duct 1. The partition members 5, 501, and 502 are preferably formed of a metal material having high thermal conductivity, such as aluminum or copper.

The partition member 5 illustrated in FIG. 5 has a partition wall 50 and a bottom plate 59. A rear end surface 591 of the bottom plate 59 is an upwardly inclined slope. On the other hand, a front end surface of the base portion 21 of the heat sink 2 is a downwardly inclined slope and is substantially parallel to the rear end surface 591 that is an upwardly inclined slope. The two slopes (the rear end surface 591 and the front end surface of the base portion 21) are in contact with each other. Accordingly, heat of the heat sink 2 is also conducted to the partition member 5. It is preferable that the two slopes be in contact with each other with a thermal interface material (TIM) interposed therebetween. Examples of the thermal interface material include thermally conductive grease.

The partition wall 50 is a wall along the Z-axis direction and stands up between the central position in a width direction (the X-axis direction) of the heat sink 2 and a position between the fan 3 and the fan 4. The partition wall 50 separates air sent by the fan 3 and air sent by the fan 4 so that flows of the air do not interfere with each other. The partition wall 50 guides air sent by the fans 3 and 4 to the heat sink 2 without mixing the air. The partition wall 50 is an example of a second wall portion disclosed herein.

The partition member 501 illustrated in FIG. 6 further includes separation walls 51 and 52 in addition to the configuration of the partition member 5. The separation walls 51 and 52 are provided substantially parallel to the partition wall 50.

The separation wall 51 is a wall that passes through a position between the side wall 15 and the partition wall 50 from a central portion of the fan 3 to the fin 22 of the heat sink 2. The separation wall 51 is an example of a first separation wall disclosed herein.

The separation wall 52 is a wall that passes through a position between the side wall 16 and the partition wall 50 from a central portion of the fan 4 to the fin 22 of the heat sink 2. The separation wall 52 is an example of a second separation wall disclosed herein.

Here, the partition member 5 and the partition member 501 described above can be manufactured by, for example, extruding a metal material in the Y-axis direction and processing an end surface.

The partition member 502 illustrated in FIG. 7 includes the separation walls 51 and 52 as in FIG. 6, and the separation walls 51 and 52 are not parallel to the partition wall 50. The separation walls 51 and 52 face each other in a manner in which an interval therebetween is reduced as they are closer to downstream in an air flow direction (a Y-axis negative direction) in the duct 1. An angle (an included angle) defined by the partition wall 50 and the separation wall 51 or 52 is an acute angle. Extrusion is not suitable for the partition member 502 because the separation walls 51 and 52 are not parallel to the partition wall 50. The partition member 502 can be easily formed by a processing method such as hemming (revenge folding and crush bending). When the partition member 502 is provided with a portion corresponding to the rear end surface 591 as described above, for example, a method of bending a rear edge of the bottom plate 59 to form a slope portion parallel to an end surface of the base portion 21 can be considered.

Figure 8:
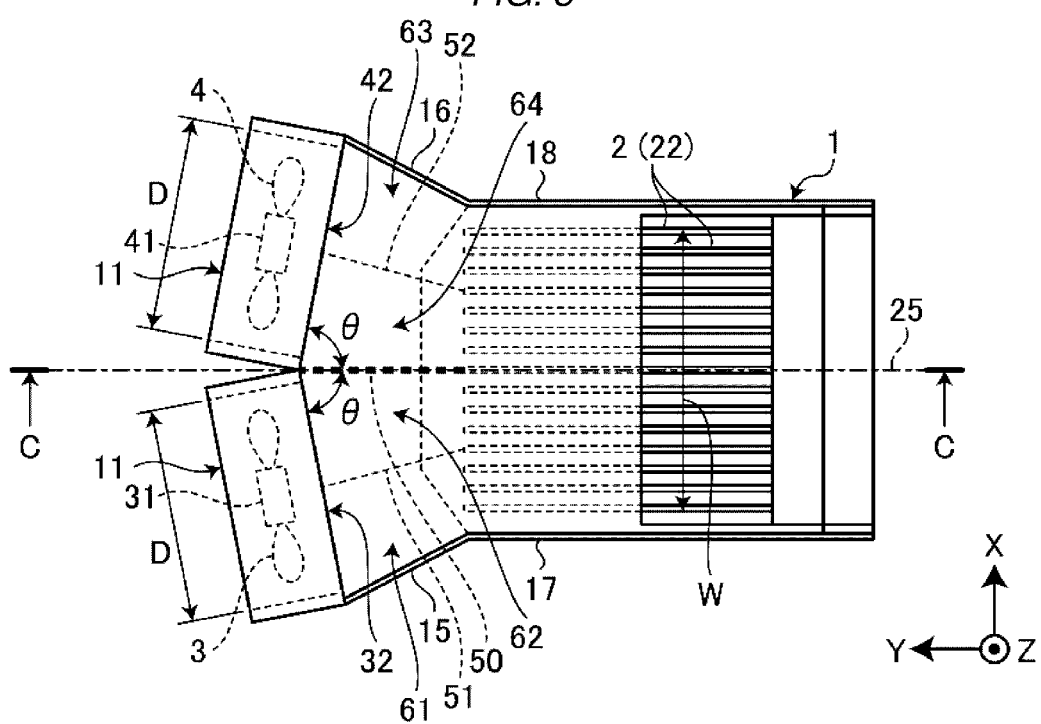
FIG. 8 is a plan view illustrating an example of an arrangement state of fans in the duct.
Figure 9:
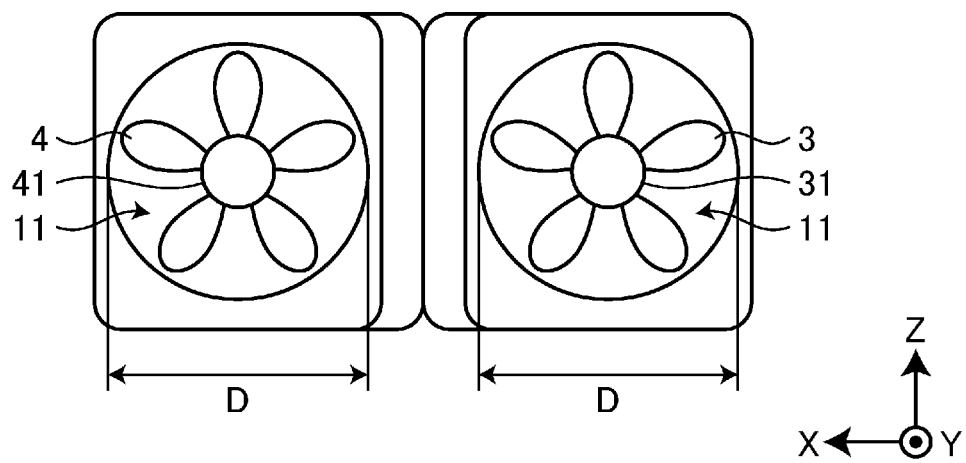
FIG. 9 is a front view illustrating the example.
Figure 10:
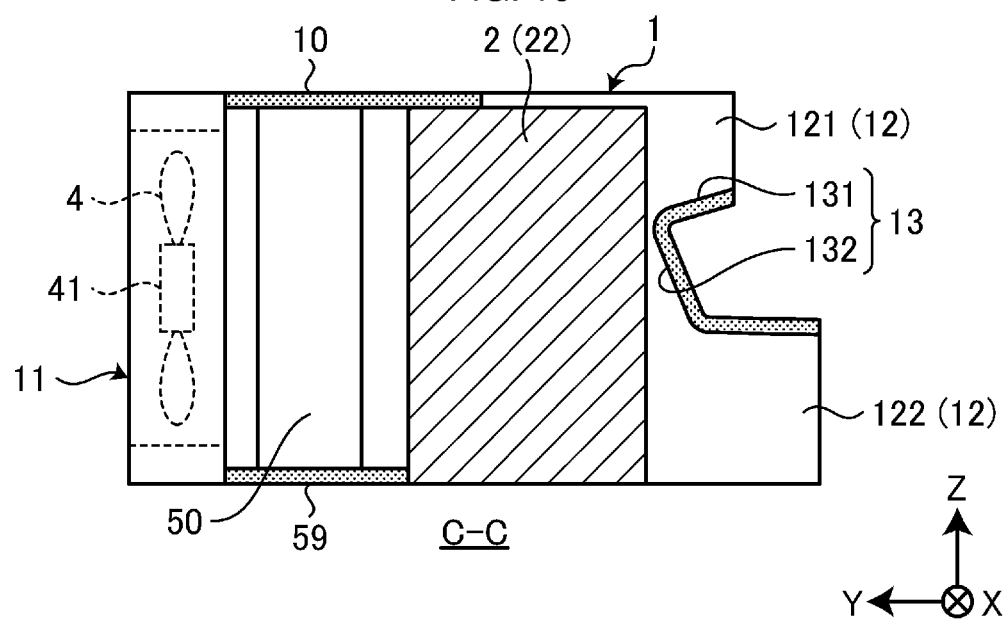
FIG. 10 is a longitudinal cross sectional view illustrating the example.

FIG. 8 is a plan view illustrating an example of an arrangement state of the fans 3 and 4 in the duct 1. FIG. 9 is a front view illustrating the example of the arrangement state of the fans 3 and 4 in the duct 1. FIG. 10 is a longitudinal cross sectional view illustrating the example of the arrangement state of the fans 3 and 4 in the duct 1. FIG. 10 is a cross sectional view taken along a line C-C illustrated in FIG. 8. In the example illustrated in FIGS. 8, 9, and 10, the partition member 502 illustrated in FIG. 7 is used.

As illustrated in FIGS. 8 and 9, the fan 3 includes a plurality of blades that rotate around a rotation shaft 31. The fan 3 discharges, from a first discharge surface 32, air taken in from the intake port 11. The first discharge surface 32 is a circular region having a diameter D. Similarly, the fan 4 includes a plurality of blades that rotate around a rotation shaft 41. The fan 4 discharges, from a second discharge surface 42, air taken in from the intake port 11. The second discharge surface 42 is a circular region having the diameter D.

The fan 3 and the fan 4 have the same size. The sizes of the fan 3 and the fan 4 are set such that a sum 2D of the diameter D of the first discharge surface 32 and the diameter D of the second discharge surface 42 is larger than a width W of the heat sink 2.

The first discharge surface 32 from which the fan 3 discharges air and the second discharge surface 42 from which the fan 4 discharges air are disposed upstream of the heat sink 2 in a manner of being symmetrical relative to an imaginary plane 25 that passes through the central position in the width direction of the heat sink 2 and is parallel to the fins 22.

More specifically, in FIG. 8, an angle θ between the first discharge surface 32 and the imaginary plane 25 and the angle θ between the second discharge surface 42 and the imaginary plane 25 are set to be equal to each other, and an included angle (2θ) between the first discharge surface 32 and the second discharge surface 42 is set to 90° or more. That is, the angle θ is 45° or more.

Further, a casing of the fan 3 and a casing of the fan 4 are adjacent to each other without a gap. Accordingly, the casing of the fans 3, the casing of the fans 4, the side walls 15 and 16, and the top plate 10 (see FIG. 4) define a space upstream of the heat sink 2. Therefore, air sent by the fan 3 and the fan 4 reaches the heat sink 2 without leaking to the outside of the duct 1.

Between the central position in the width direction of the heat sink 2 and a position where the casing of the fan 3 and the casing of the fan 4 are in contact with each other, the cooling device 200 includes the partition wall 50 that guides air discharged from the first discharge surface 32 and air discharged from the second discharge surface 42 to the heat sink 2 without mixing the air. The partition wall 50 is, for example, a rib standing in the Z-axis positive direction.

In this manner, air discharged from the first discharge surface 32 and air discharged from the second discharge surface 42 do not come into contact with each other by providing the partition wall 50, and thus the air discharged from the first discharge surface 32 and the air discharged from the second discharge surface 42 do not affect each other. Accordingly, air suctioned by the fan 3 and air suctioned by the fan 4 are guided in a direction along the fins 22 of the heat sink 2.

Further, the separation wall 51 that reaches the fin 22 of the heat sink 2 is provided inside the duct 1 through a position on the first discharge surface 32 and a position between the partition wall 50 and the side wall 15 at the side of the fan 3. The separation wall 51 is thinner than the partition wall 50. The separation wall 51 is, for example, a rib standing in the Z-axis positive direction.

A flow path 61 and a flow path 62 independent of each other are formed between the first discharge surface 32 and the heat sink 2 by the separation wall 51. The flow path 61 is a space that is defined by the top plate 10 and the mother board 101 in the up-down direction (the Z-axis direction) and is defined by the side wall 15 and the separation wall 51 in the left-right direction (the X-axis direction). The flow path 62 is a space that is defined by the top plate 10 and the mother board 101 in the up-down direction (the Z-axis direction) and is defined by the separation wall 51 and the partition wall 50 in the left-right direction (the X-axis direction).

Further, the separation wall 52 that reaches the fin 22 of the heat sink 2 is provided inside the duct 1 through a position on the second discharge surface 42 and a position between the partition wall 50 and the side wall 16 at the side of the fan 4. The separation wall 52 is thinner than the partition wall 50. The separation wall 52 is, for example, a rib standing in the Z-axis positive direction.

A flow path 63 and a flow path 64 independent of each other are formed between the second discharge surface 42 and the heat sink 2 by the separation wall 52. The flow path 63 is a space that is defined by the top plate 10 and the mother board 101 in the up-down direction (the Z-axis direction) and is defined by the side wall 16 and the separation wall 52 in the left-right direction (the X-axis direction). The flow path 64 is a space that is defined by the top plate 10 and the mother board 101 in the up-down direction (the Z-axis direction) and is defined by the separation wall 52 and the partition wall 50 in the left-right direction (the X-axis direction).

The side walls 15 and 16 of the duct 1 are provided in a manner in which an interval between the side walls 15 and 16 is gradually reduced from the intake ports 11 to the heat sink 2. Therefore, air sent by the fan 3 is directed toward the central portion in the width direction of the heat sink 2 along the side wall 15, and air sent by the fan 4 is directed toward the central portion in the width direction of the heat sink 2 along the side wall 16.

Here, when the partition wall 50 and the separation walls 51 and 52 are not provided, air sent by the fan 3 and air sent by the fan 4 collide with each other at the central portion in the width direction of the heat sink 2, and flows of the air are disturbed. In this case, a flow velocity may be reduced, which is not preferable.

In the present embodiment, air sent by the fan 3 and air sent by the fan 4 are not mixed with each other by providing the partition wall 50, and thus stability of a flow of air in the duct 1 can be improved.

In this example, the separation wall 51 is provided between a central position of the first discharge surface 32 and a central position between the side wall 15 and the partition wall 50 that reach the heat sink 2. Therefore, substantially the same amount of air flows through the flow path 61 and the flow path 62. Similarly, the separation wall 52 is formed between a central position of the second discharge surface 42 and a central position between the side wall 16 and the partition wall 50 that reach the heat sink 2, and thus substantially the same amount of air flows through the flow path 63 and the flow path 64. Accordingly, a uniform amount of air is sent to the fins 22 of the heat sink 2 regardless of locations of the fins 22. Therefore, uniform cooling performance can be obtained regardless of locations of the fins 22.

As illustrated in FIG. 10, air that passed between the fins 22 of the heat sink 2 reaches the branch wall 13. The branch wall 13 includes the upper wall portion 131 and the lower wall portion 132. The upper wall portion 131 and the lower wall portion 132 are connected by a side along the X axis upstream in an air blowing direction. The upper wall portion 131 and the lower wall portion 132 are inclined relative to the air blowing direction in a manner in which a distance between the upper wall portion 131 and the lower wall portion 132 increases as they are closer to downstream in the air blowing direction. The upper wall portion 131 guides air that passed between the fins 22 of the heat sink 2 obliquely upward and discharges the air from the upper exhaust port 121. The lower wall portion 132 guides air that passed between the fins 22 of the heat sink 2 obliquely downward and discharges the air from the lower exhaust port 122. In this manner, the branch wall 13 guides exhausted air in a manner of avoiding a partial range present downstream of the branch wall 13, and the exhausted air branches. Therefore, even when a peripheral device such as the I/O board 106 (see FIG. 3) is disposed downstream of the branch wall 13, cooling performance of the heat sink 2 is not hindered.

Other Embodiments

Figure 11:
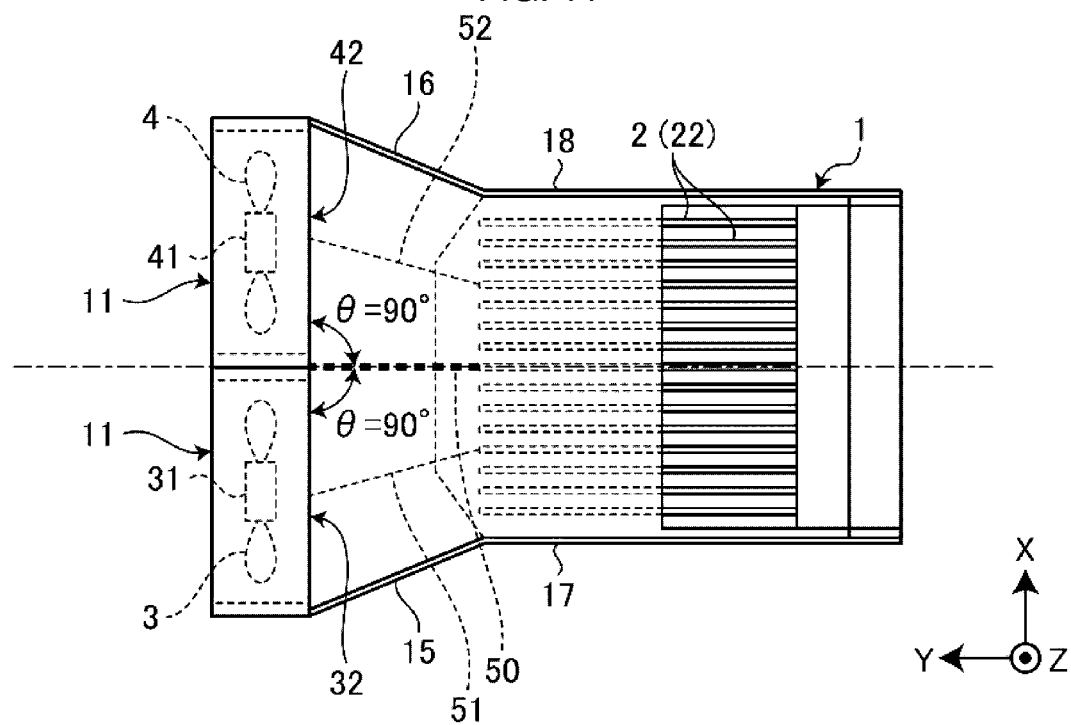
FIG. 11 is a plan view illustrating an arrangement state of fans according to a second embodiment.
Figure 12:
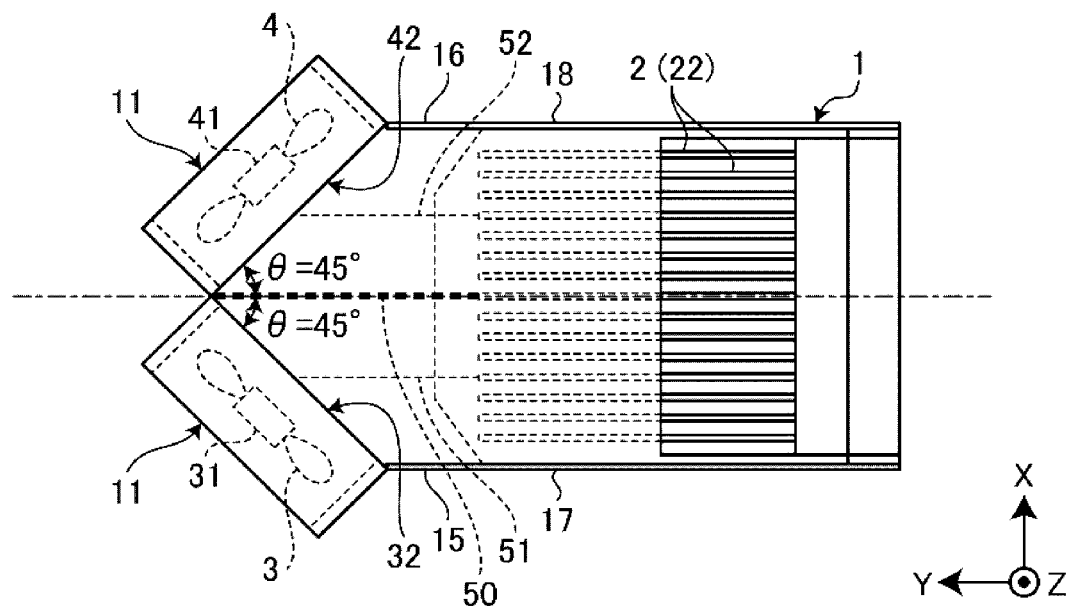
FIG. 12 is a plan view illustrating an arrangement state of fans according to a third embodiment.

Next, other embodiments will be described. The following embodiments are modifications of the above embodiment, portions the same as those in the above embodiment are denoted by the same reference numerals, and description thereof will be omitted. FIG. 11 is a plan view illustrating an arrangement state of the fans 3 and 4 according to a second embodiment. FIG. 12 is a plan view illustrating an arrangement state of the fans 3 and 4 according to a third embodiment.

FIG. 11 illustrates an example in which the fan 3 and the fan 4 both define the angle θ of 90° with the partition wall 50. That is, an included angle (2θ) between the fan 3 and the fan 4 is set to 180°, and the fan 3 and the fan 4 are arranged side by side. The separation walls 51 and 52 in this example are not parallel to each other and are located obliquely facing each other in a similar manner to the separation walls 51 and 52 of the partition member 502 illustrated in FIG. 7.

According to this arrangement structure, air discharged from the fan 3 and the fan 4 is guided to the fins 22 of the heat sink 2 through flow paths defined by the side wall 15, the side wall 16, the partition wall 50, the separation wall 51, and the separation wall 52. Accordingly, since stability of a flow of air is maintained, high cooling performance can be maintained.

FIG. 12 illustrates an example in which the fan 3 and the fan 4 both define the angle θ of 45° with the partition wall 50. That is, an included angle (2θ) between the fan 3 and the fan 4 is set to 90°. The separation walls 51 and 52 in this example are parallel to each other in a similar manner to the separation walls 51 and 52 of the partition member 501 illustrated in FIG. 6.

According to this arrangement structure, air discharged from the fan 3 and the fan 4 is guided to the fins 22 of the heat sink 2 through flow paths defined by the side wall 15, the side wall 16, the partition wall 50, the separation wall 51, and the separation wall 52. Accordingly, since stability of a flow of air is maintained, high cooling performance can be maintained.

When the angle θ is set to be smaller than the angle θ in this example, that is, when the included angle (2θ) between the fan 3 and the fan 4 is set to be smaller than 90°, an angle defined by a traveling direction of air discharged by the fans 3 and 4 and the partition wall 50 or the separation walls 51 and 52 increases and resistance caused by a change of an air flow direction along the partition wall 50 or the separation walls 51 and 52 increases, and thus a flow of air is likely to be disturbed. In this case, a position where the first discharge surface 32 and the second discharge surface 42 are in contact with each other is away from the heat sink 2, which is not preferable. Therefore, the included angle (2θ) between the fan 3 and the fan 4 is preferably 90° or more.

Furthermore, it is not denied in the various embodiments described above that the fan 3 and the fan 4 cannot be provided in a state in which both angles θ exceed 90°. That is, the included angle (2θ) between the fan 3 and the fan 4 may be set to be larger than 1800 (for example, the included angle (2θ) may be set to about 200°). In this case, the partition wall 50 provided between a position where the casing of the fan 3 and the casing of the fan 4 are in contact with each other and the central position in the width direction of the heat sink 2 may not be flat, and for example, both surfaces of the partition wall 50 may be curved surfaces protruding toward flow paths.

Although the partition members 501 and 502 each include the two separation walls 51 and 52 that sandwich the partition wall 50 in the embodiments described above, the number of the separation walls may be three or more in practice. A direction and an amount of air from the fans 3 and 4 to the heat sink 2 can be adjusted by adjusting a position, an angle, and the number of the separation walls. For example, when a heat source (a CPU or the like) is in contact with a central portion of the base portion 21, it is preferable to adjust the position, the angle, and the number of the separation walls such that a large amount of air is blown to the fins 22 in the central portion in the width direction or such that a flow velocity in the central portion in the width direction is increased. When a heat source is in contact with a plurality of places of the base portion 21, it is preferable to adjust the position, the angle, and the number of the separation walls such that a large amount of air is blown to the fins 22 standing at the places or such that flow velocities at the places is increased.

Figure 13:
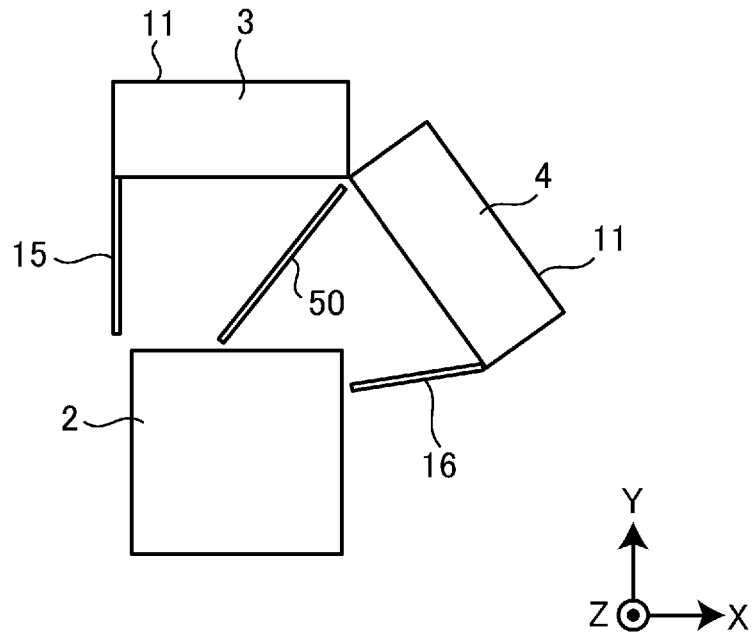
FIG. 13 is a plan view illustrating another example of a positional relationship among fans, a partition wall, and side walls.
Figure 14:
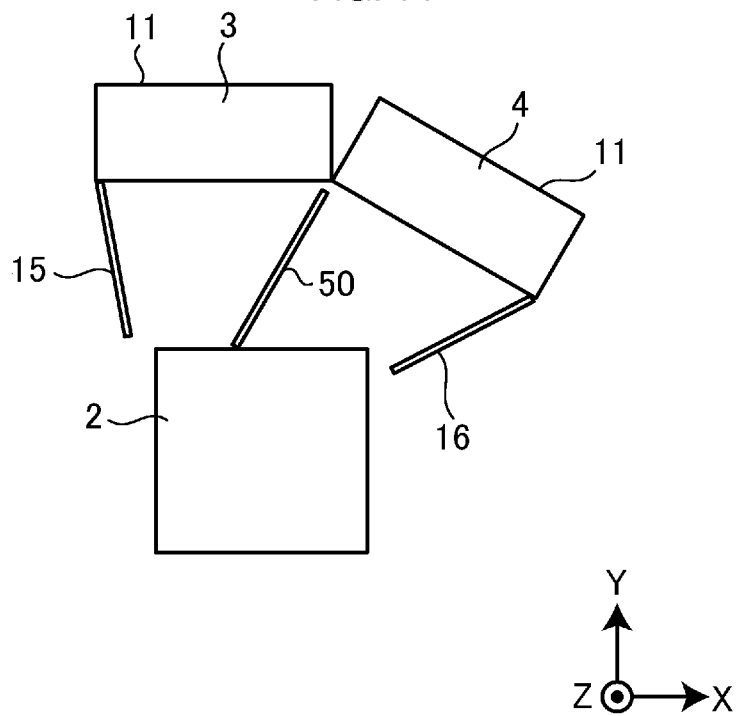
FIG. 14 is a plan view illustrating another example of a positional relationship among fans, a partition wall, and side walls.

Further, other embodiments will be described. FIGS. 13 and 14 are plan views illustrating other examples of a positional relationship between the fans 3 and 4 and the partition wall 50 and the side walls 15 and 16 (viewed from the Z-axis negative direction). FIGS. 13 and 14 illustrate examples in which the fans 3 and 4 are not symmetrical relative to the heat sink 2. As illustrated in FIGS. 13 and 14, the fans 3 and 4 do not need to be symmetrically arranged.

The fans 3 and 4 suction air to be blown to the heat sink 2 from the intake ports 11, and air flows are created at positions facing the intake ports 11. Heat generated by components located near the intake ports 11 is carried by the air flows and is taken away. That is, it can be said that air flows created by the fans 3 and 4 promote heat dissipation not only from a heat source in contact with the base portion 21 of the heat sink 2 but also from components near the intake ports 11.

In this manner, according to the embodiments described above, air sent by a plurality of fans 3 and 4 can be supplied to one heat sink 2. Therefore, even when a large-diameter fan cannot be used considering a height of the casing 110 of the electronic apparatus 100, a plurality of fans 3 and 4 that cooperatively supply air with a volume corresponding to that of a large-diameter fan can be used, so that miniaturization of a cooling fan (reduction in a height dimension) can be implemented without reducing a discharge amount of cooling air.

A flow velocity of air can be increased by gradually reducing, from upstream to downstream, cross-sectional areas of the flow paths 61 to 64 that are formed from the fans 3 and 4 to the heat sink 2.

Further, a flow of air sent by the fan 3 and a flow of air sent by the fan 4 can be prevented from interfering with each other by providing the partition wall 50, and efficient cooling can be implemented.

A flow direction, a flow rate, and a flow velocity of air blown to the heat sink 2 by the fans 3 and 4 can be adjusted by providing the separation walls 51 and 52 and setting directions of the separation walls 51 and 52. With such an adjustment, a uniform amount of air can be sent to the fins 22 of the heat sink 2 regardless of locations of the fins 22, and uniform cooling performance can be obtained regardless of locations of the fins 22. On the other hand, with such an adjustment, cooling performance of the heat sink 2 can be improved by increasing a flow velocity or a flow rate of air flowing around the fins 22 having a large amount of heat.

Although the fans 3 and 4 in the embodiments described above have the same size, sizes of a plurality of fans 3 and 4 do not necessarily have to be the same, and the plurality of fans 3 and 4 may have different outputs (an air flow velocity and an air flow rate).

As described above, the cooling device 200 according to the embodiments includes the heat sink 2, the fan (a first air blower) 3, the fan (a second air blower) 4, the duct 1, and the partition members 5, 501, and 502. The heat sink 2 includes a plurality of fins 22 standing side by side in a thickness direction on the base portion 21 that conducts heat of an electronic component such as the CPU 102. The fan 3 is rotated to blow air so as to create a flow of air between the fins 22, and has the first discharge surface 32 for discharging the air toward the heat sink 2. The fan 4 is rotated to blow air so as to create a flow of air between the fins 22, has the second discharge surface 42 for discharging the air toward the heat sink 2, and is provided adjacent to the fan 3. The duct 1 covers the heat sink 2, the fan 3, and the fan 4, and has the intake ports 11 upstream and the exhaust port 12 downstream in an air blowing direction of the fans 3 and 4. The partition members 5, 501, and 502 are provided between the fans 3 and 4 and the heat sink 2, and each have the bottom plate 59 and the partition wall 50. The bottom plate 59 is in contact with the base portion 21 and configured to conduct heat of the base portion, and the partition wall 50 stands on the bottom plate 59 and divides a space above the bottom plate 59 from a position between the first discharge surface 32 and the second discharge surface 42 to one of the fins 22.

With such a structure of the cooling device 200, air can be blown to the heat sink 2 by a plurality of fans 3 and 4, and air flows from the fans can be sent to the heat sink 2 without interfering with each other. Accordingly, the heat sink 2 is cooled by the two fans 3 and 4 of which a sum of diameters of the discharge surfaces is larger than a width of the heat sink 2, energy loss can be reduced, and cooling can be efficiently performed. Further, since the base portion 21 and the bottom plate 59 are in contact with each other, heat of the heat sink 2 is conducted to the partition members 5, 501, and 502. Since the partition wall 50 receives air blown by the fans 3 and 4, heat conducted from the bottom plate 59 can be well dissipated. In this manner, the partition members 5, 501, and 502 function as an auxiliary heat sink.

In the cooling device 200 according to the embodiments, end surfaces of the bottom plate 59 and the base portion 21 are in contact with each other, and the end surfaces are slopes facing each other.

Accordingly, heat can be easily conducted from the base portion 21 to the bottom plate 59.

In the cooling device 200 according to the embodiments, the partition members 501 and 502 each further include one or more pairs of separation walls 51 and 52. The separation walls 51 and 52 further divide the space divided by the partition wall 50, and divide the space from central portions of the fan 3 and the fan 4 to one of the fins 22.

In the cooling device 200, it is possible to adjust a range of the heat sink 2 where air is to be blown and how much air is blown by providing the separation walls 51 and 52. Since the separation walls 51 and 52 receive air blown by the fans 3 and 4, heat conducted from the bottom plate 59 is well dissipated. Accordingly, the function of the partition member 501 and 502 as an auxiliary heat sink is enhanced.

In the cooling device 200 according to the embodiments, the separation walls 51 and 52 divide the space from the fan 3 and the fan 4 to the heat sink 2 and are provided at positions or angles at which a flow rate or a flow velocity of air flowing between the fins 22 that stand at positions of the base portion 21 where an electronic component such as the CPU 102 and the like is in contact with the base portion 21 is larger than a flow rate or a flow velocity of air around the other fins 22.

Accordingly, cooling performance of the cooling device 200 can be improved.

In the cooling device 200 according to the embodiments, the partition members 5, 501, and 502 may be continuously formed by processing a plate-shaped metal material by hemming.

Accordingly, it is possible to widen options for methods of manufacturing the partition members 5, 501, and 502, and it is possible to increase the degree of freedom of installation positions and angles of the partition wall 50 and the separation walls 51 and 52.

While certain embodiments are described above, these embodiments are presented by way of examples only, and are not intended to limit the scope of the disclosure. Novel embodiments can be implemented in various other forms, and various omissions, substitutions, modifications, and combinations may be made within a scope not departing from the gist of the disclosure. The embodiments and modifications are included in the scope and the gist of the disclosure, and included in the inventions described in the claims and the scope of equivalents of the inventions.

What is claimed is:

1. A cooling device for an electronic apparatus, comprising:
    a heat sink having a plurality of fins standing side by side in a thickness direction on a base portion that conducts heat of an electronic component;
    a first air blower configured to rotate to blow air so as to create a flow of air between the fins, the first air blower comprising a first discharge surface for discharging the air toward the heat sink;
    a second air blower configured to rotate to blow air so as to create a flow of air between the fins, the second air blower comprising a second discharge surface for discharging the air toward the heat sink, and provided adjacent to the first air blower;
    a duct that covers the heat sink, the first air blower, and the second air blower, and that comprises intake ports upstream and an exhaust port downstream in an air blowing direction of the first air blower and the second air blower; and
    a partition member that is provided between the heat sink and the first air blower and the second air blower, the partition member comprising a bottom plate and a partition wall, the bottom plate being in contact with the base portion and configured to conduct heat of the base portion, the partition wall standing on the bottom plate and dividing a space above the bottom plate from a position between the first discharge surface and the second discharge surface to one of the fins.

2. The cooling device according to claim 1, wherein end surfaces of the bottom plate and the base portion are in contact with each other, and the end surfaces are slopes facing each other.

3. The cooling device according to claim 1, wherein the partition member further comprises one or more pairs of separation walls that further divide the space divided by the partition wall and that divide the space from central portions of the first air blower and the second air blower to one of the fins.

4. The cooling device according to claim 3, wherein the separation walls divide the space from the first air blower and the second air blower to the heat sink and are provided at positions or angles at which a flow rate or a flow velocity of air flowing between the fins standing at positions of the base portion where the electronic component is in contact with the base portion is larger than a flow rate or a flow velocity of air around the other fins.

5. The cooling device according to claim 1, wherein the partition member is continuously formed by hemming a plate-shaped metal material.

6. The cooling device according to claim 1, wherein the heat sink comprises at least one of aluminum and copper.

7. The cooling device according to claim 1, wherein the plurality of fins are positioned with respect to one another in a predetermined interval.

8. An electronic apparatus, comprising:
    an electronic component; and
    a cooling device comprising:
        a heat sink having a plurality of fins standing side by side in a thickness direction on a base portion that conducts heat of the electronic component;
        a first air blower configured to rotate to blow air so as to create a flow of air between the fins, the first air blower comprising a first discharge surface for discharging the air toward the heat sink;
        a second air blower configured to rotate to blow air so as to create a flow of air between the fins, the second air blower comprising a second discharge surface for discharging the air toward the heat sink, and provided adjacent to the first air blower;
        a duct that covers the heat sink, the first air blower, and the second air blower, and that comprises intake ports upstream and an exhaust port downstream in an air blowing direction of the first air blower and the second air blower; and
        a partition member that is provided between the heat sink and the first air blower and the second air blower, the partition member comprising a bottom plate and a partition wall, the bottom plate being in contact with the base portion and configured to conduct heat of the base portion, the partition wall standing on the bottom plate and dividing a space above the bottom plate from a position between the first discharge surface and the second discharge surface to one of the fins.

9. The electronic apparatus according to claim 8, wherein end surfaces of the bottom plate and the base portion are in contact with each other, and the end surfaces are slopes facing each other.

10. The electronic apparatus according to claim 8, wherein
the partition member further comprises one or more pairs of separation walls that further divide the space divided by the partition wall and that divide the space from central portions of the first air blower and the second air blower to one of the fins.

11. The electronic apparatus according to claim 10, wherein
the separation walls divide the space from the first air blower and the second air blower to the heat sink and are provided at positions or angles at which a flow rate or a flow velocity of air flowing between the fins standing at positions of the base portion where the electronic component is in contact with the base portion is larger than a flow rate or a flow velocity of air around the other fins.

12. The electronic apparatus according to claim 8, wherein
the partition member is continuously formed by hemming a plate-shaped metal material.

13. The electronic apparatus according to claim 8, wherein
the heat sink comprises at least one of aluminum and copper.

14. The electronic apparatus according to claim 8, wherein
the plurality of fins are positioned with respect to one another in a predetermined interval.

15. A personal computer, comprising:
a CPU; and
a cooling device comprising:
a heat sink having a plurality of fins standing side by side in a thickness direction on a base portion that conducts heat of the CPU;
a first air blower configured to rotate to blow air so as to create a flow of air between the fins, the first air blower comprising a first discharge surface for discharging the air toward the heat sink;
a second air blower configured to rotate to blow air so as to create a flow of air between the fins, the second air blower comprising a second discharge surface for discharging the air toward the heat sink, and provided adjacent to the first air blower;
a duct that covers the heat sink, the first air blower, and the second air blower, and that comprises intake ports upstream and an exhaust port downstream in an air blowing direction of the first air blower and the second air blower; and
a partition member that is provided between the heat sink and the first air blower and the second air blower, the partition member comprising a bottom plate and a partition wall, the bottom plate being in contact with the base portion and configured to conduct heat of the base portion, the partition wall standing on the bottom plate and dividing a space above the bottom plate from a position between the first discharge surface and the second discharge surface to one of the fins.

16. The personal computer according to claim 15, wherein end surfaces of the bottom plate and the base portion are in contact with each other, and the end surfaces are slopes facing each other.

17. The personal computer according to claim 15, wherein the partition member further comprises one or more pairs of separation walls that further divide the space divided by the partition wall and that divide the space from central portions of the first air blower and the second air blower to one of the fins.

18. The personal computer according to claim 17, wherein the separation walls divide the space from the first air blower and the second air blower to the heat sink and are provided at positions or angles at which a flow rate or a flow velocity of air flowing between the fins standing at positions of the base portion where the electronic component is in contact with the base portion is larger than a flow rate or a flow velocity of air around the other fins.

19. The personal computer according to claim 15, wherein the partition member is continuously formed by hemming a plate-shaped metal material.

20. The personal computer according to claim 15, wherein the heat sink comprises at least one of aluminum and copper and the plurality of fins are positioned with respect to one another in a predetermined interval.

* * * * *